United States Patent
Huang et al.

(10) Patent No.: US 10,281,515 B2
(45) Date of Patent: May 7, 2019

(54) DEVICES AND METHODS FOR ARC FAULT DETECTION

(71) Applicant: Siemens Aktiengesellschaft, München (DE)

(72) Inventors: Li Ming Huang, Beijing (CN); Yue Zhuo, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 542 days.

(21) Appl. No.: 15/022,218

(22) PCT Filed: Aug. 1, 2014

(86) PCT No.: PCT/EP2014/066647
§ 371 (c)(1),
(2) Date: Mar. 16, 2016

(87) PCT Pub. No.: WO2015/101426
PCT Pub. Date: Jul. 9, 2015

(65) Prior Publication Data
US 2016/0341782 A1    Nov. 24, 2016

(30) Foreign Application Priority Data

Dec. 31, 2013    (WO) ................ PCT/CN2013/091011

(51) Int. Cl.
*H02H 1/00*    (2006.01)
*G01R 31/12*    (2006.01)

(52) U.S. Cl.
CPC ....... *G01R 31/1209* (2013.01); *H02H 1/0023* (2013.01)

(58) Field of Classification Search
CPC .................... G01R 31/1209; H01H 1/0023
(Continued)

(56) References Cited

U.S. PATENT DOCUMENTS

2003/0169051 A1    9/2003    Tallman et al.
2005/0134285 A1    6/2005    Mernyk
(Continued)

FOREIGN PATENT DOCUMENTS

| CN | 1918680 A | 2/2007 |
|----|-----------|--------|
| CN | 101666852 A | 3/2010 |

(Continued)

OTHER PUBLICATIONS

International Search Report PCT/ISA/210 for International Application No. PCT/EP2014/066647 dated Oct. 1, 2014.
(Continued)

*Primary Examiner* — Dharti H Patel
(74) *Attorney, Agent, or Firm* — Harness, Dickey & Pierce, P.L.C.

(57) ABSTRACT

Devices and methods for arc fault detection, based on arc sound signals, are disclosed. The device can monitor sound data from a power device by one or more microphones arranged near the power device and extract the characteristic of the sound data. The device can also compare the characteristic of the sound data with the arc fault feature database, and then determine to generate an arc alarm signal. The device is a stand-alone device, which can provide the forecast and early warning of arc faults, and can improve the reliability of arc fault detection.

22 Claims, 5 Drawing Sheets

(58) Field of Classification Search
USPC .......................................................... 361/2–6
See application file for complete search history.

(56) References Cited

U.S. PATENT DOCUMENTS

| | | |
|---|---|---|
| 2005/0194979 A1 | 9/2005 | Roman et al. |
| 2006/0164097 A1* | 7/2006 | Zhou .................. G01R 31/1209 324/529 |
| 2006/0203401 A1 | 9/2006 | Kojori et al. |
| 2008/0288189 A1 | 11/2008 | Rao et al. |

FOREIGN PATENT DOCUMENTS

| | | |
|---|---|---|
| CN | 101673934 A | 3/2010 |
| CN | 101696986 A | 4/2010 |
| CN | 102288857 A | 12/2011 |
| WO | WO-2011090464 A1 | 7/2011 |

OTHER PUBLICATIONS

Written Opinion of the International Searching Authority PCT/ISA/237 for International Application No. PCT/EP2014/066647 dated Oct. 1, 2014.

International Search Report PCT/ISA/210 for International Application No. PCT/CN2013/091011 dated Sep. 30, 2014.

Chinese Office Action and English translation thereof dated Jan. 22, 2018.

\* cited by examiner

DEVICES AND METHODS FOR ARC FAULT DETECTION

PRIORITY STATEMENT

This application is the national phase under 35 U.S.C. § 371 of PCT International Application No. PCT/EP2014/066647 which has an International filing date of Aug. 1, 2014, which designated the United States of America and which claims priority to PCT International Application PCT/CN2013/091011 filed Dec. 31, 2013, the entire contents of which are hereby incorporated herein by reference.

FIELD

The present application relates generally to arc fault detection. In particular, the present application relates to systems and methods for arc fault detection based on arc sound signal.

BACKGROUND

Arc Flash Fault is a disastrous electrical accident in power system, for example, in the switchgear, which is an explosion of heat, hot gases, and molten metal usually caused by a short circuit of energized conductors. To protect workers and power equipment against this hazard, arc fault protection system is needed. A number of equipment fire and burndown cases arising from low-level arcing faults have been reported in the past. The conventional protection devices relying upon the change in device voltages and currents cannot detect the low-level arcing faults. The reason is that the low-level arcing faults do not cause significant changes in device voltages and currents. The ordinary protection devices themselves are involved in the burndown taking place in the switchgear and let the fault propagate like a chain reaction.

The arc fault protection systems based on arc light detection have been widely used. However, such systems are easily disturbed by ambient light, which may cause a false operation. And these systems can be activated only after the arc flash occurs, so the fault response time enlarges the impact of the arc flash fault on the switchgear system. Another detection technique based on four different types of sensors (ultrasonic, infrared, radio-frequency and acoustic radiations) has been proposed, which compares the incoming signals with pre-set thresholds to decide if the arcing fault has taken place. But this detection scheme has strict requirements regarding the placement of various sensors and the setting of these thresholds, which decreases the efficiency of the detection.

There are solutions which use an expensive optic-fiber microphone as the sensor to pick up the arc sound, and compare the sound pressure level of the arc sound signal or the energy of certain sub-bands of the arc sound signal with a pre-determined threshold to judge if the arc fault occurs. These solutions are not effective because the detection logic is too simple and easily disturbed by environment noise or electrical background noise.

SUMMARY

Embodiments of the invention provide methods and devices for arc fault detection based on arc acoustic data.

An embodiment of the present application is directed to a method for arc fault detection. The method includes obtaining sound data from a power device, and extracting from the sound data, a feature vector characterising the frequency domain sub-band energy distribution of the sound data. The method also includes comparing the feature vector with a plurality of reference vectors based on actual arc fault acoustic signals, to determine to generate an arc alarm signal or not. Thus, the method can provide the forecast and early warning of arc faults before arc flash faults occur, and may improve the stability and reliability of the arc fault detection compared with other detection methods that compare the sound pressure level or the energy of certain sub-bands of the arc sound signal with a preset value.

An embodiment of the present application is directed to an apparatus for arc fault detection. The apparatus comprises means for obtaining sound data from a power device; means for extracting from the sound data, a feature vector characterising the frequency domain sub-band energy distribution of the sound data; and means for comparing the feature vector with a plurality of reference vectors based on actual arc fault acoustic signals, to determine to generate an arc alarm signal or not.

An embodiment of the present application is directed to a device for arc fault detection. The proposed device comprises one or more sound sensors, a feature extraction unit and a feature comparison unit. The sensors are arranged near a power device and obtain sound data from the power device. The feature extraction unit extracts from the sound data, a feature vector characterising the frequency domain sub-band energy distribution of the sound data. The feature comparison unit compares the feature vector with a plurality of reference vectors based on actual arc fault acoustic signals, to determine to generate an arc alarm signal or not. The device can provide the forecast and early warning of arc faults before arc flash faults occur, and may improve the stability and reliability of the arc fault detection. Furthermore, the device is a stand-alone device and does not need any physical connection with the primary power system in the switchgear.

The details of various embodiments of the invention are set forth in the accompanying drawings and the description below.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION OF EXAMPLE EMBODIMENTS

Figure 1:
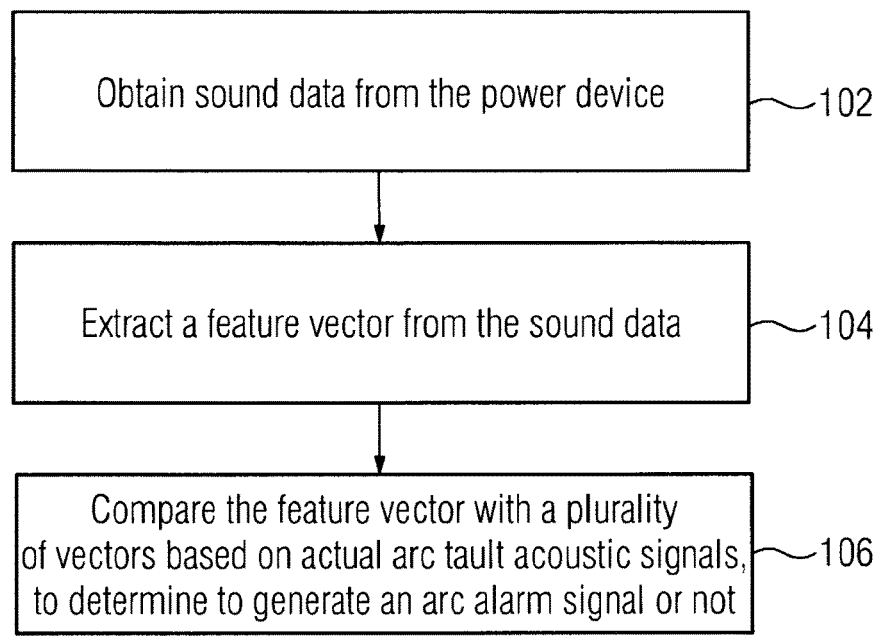
FIG. 1 illustrates a flow diagram of an embodiment of a method for arc fault detection.

An embodiment of the present application is directed to a method for arc fault detection. The method includes obtaining sound data from a power device, and extracting from the sound data, a feature vector characterising the frequency domain sub-band energy distribution of the sound data. The method also includes comparing the feature vector with a plurality of reference vectors based on actual arc fault acoustic signals, to determine to generate an arc alarm signal or not. Thus, the method can provide the forecast and early warning of arc faults before arc flash faults occur, and may improve the stability and reliability of the arc fault detection compared with other detection methods that compare the sound pressure level or the energy of certain sub-bands of the arc sound signal with a preset value.

According to an embodiment of the invention, the method may include identifying from the sound data, an unusual sound and extracting the feature vector in response to the identification of the unusual sound, where the difference between the noise floor of the unusual sound and the noise floor of previous sound is larger than a preset value. So, the feature extraction may be performed only when an unusual sound occurs, which further increases the efficiency of the detection.

According to an embodiment of the invention, the method may include obtaining sound data with one or more sensors capable of picking up sound data in dual sound bands which are the audible sound band and the ultrasound band, monitoring ultrasounds in the sound data, and starting to extract the feature vector from the sound data in the audible band when ultrasounds are detected in the sound data.

According to an embodiment of the invention, the method may include passing sound data in the ultrasound band, comparing the sound pressure level of the passed sound data in the ultrasound band with a reference value, and starting to extract the feature vector from the sound data in the audible band when the sound pressure level of the passed sound data in the ultrasound band is greater than the reference value.

According to an embodiment of the invention, the plurality of reference vectors had been extracted from actual arc fault acoustic signals and is stored in an arc fault feature database. The method may determine to generate an arc alarm signal if the distance between the feature vector and one of the plurality of reference vectors is less than a pre-determined threshold. The arc fault feature database may also include a plurality of reference vectors which had been extracted from all kinds of interference signals. The method may calculate a distance between the feature vector and each of the plurality of reference vectors from actual arc fault acoustic signals, calculate a distance between the feature vector and each of the plurality of reference vectors from interference signals, and determine to generate an arc alarm signal if the minimum distance between the feature vector and the plurality of reference vectors from actual arc fault acoustic signals is less than the minimum distance between the feature vector and the plurality of reference vectors from interference signals. Therefore, the method can reduce false operations and improve the reliability of the arc fault detection.

According to an embodiment of the invention, the sound data may be obtained by one or more sound sensors arranged near the power device. The sound sensor may be a MEMS (Micro-electromechanical Systems) microphone, which can pick up sound data and output digital sound signals. Such a digital MEMS microphone has better performance than conventional Electret-based microphones, and may reduce costs compared with the optic-fiber microphone that is too expensive to be widely used into market. Moreover, when the optic-fiber microphone is used to obtain the sound data, the sound data need to be converted into digital sound signals, for example, by an additional analog-to-digital conversion circuit or device.

According to an embodiment of the invention, the MEMS microphones are arranged as a microphone array, such as a broadside array, end-fire array, etc. The use of the microphone array can restrain the environment noise, echo and reverberation in the power device such as switchgear. The method can be implemented in hardware with Digital Signal Processor (DSP) or Field Programmable Gata Array (FPGA) chips. The MEMS microphone may be connected to the DSP or FPGA chip via synchronous serial digital port (SPORT).

An embodiment of the present application is directed to an apparatus for arc fault detection. The apparatus comprises means for obtaining sound data from a power device; means for extracting from the sound data, a feature vector characterising the frequency domain sub-band energy distribution of the sound data; and means for comparing the feature vector with a plurality of reference vectors based on actual arc fault acoustic signals, to determine to generate an arc alarm signal or not.

An embodiment of the present application is directed to a device for arc fault detection. The proposed device comprises one or more sound sensors, a feature extraction unit and a feature comparison unit. The sensors are arranged near a power device and obtain sound data from the power device. The feature extraction unit extracts from the sound data, a feature vector characterising the frequency domain sub-band energy distribution of the sound data. The feature comparison unit compares the feature vector with a plurality of reference vectors based on actual arc fault acoustic signals, to determine to generate an arc alarm signal or not. The device can provide the forecast and early warning of arc faults before arc flash faults occur, and may improve the stability and reliability of the arc fault detection. Furthermore, the device is a stand-alone device and does not need any physical connection with the primary power system in the switchgear.

According to an embodiment of the invention, the device may further comprise an acoustic detection unit for identifying from the sound data, an unusual sound, where the difference between the noise floor of the unusual sound and the noise floor of previous sound is larger than a preset value. The feature extraction unit may extract the feature vector in response to the identification of the unusual sound, which further increases the efficiency of the detection.

According to an embodiment of the invention, wherein the one or more sound sensors are capable of obtaining sound data with dual sound bands which are the audible sound band and the ultrasound band, and the device further comprises an ultrasound detection unit which monitors the sound data in the ultrasound band obtained by the one or more sound sensors, and a feature extraction unit which extracts the feature vector from the sound data in the audible band.

According to an embodiment of the invention, wherein the sound sensors include one audible sound sensor and one ultrasound sensor, the ultrasound sensor is connected with the ultrasound detection unit, and the audible sound sensor is connected with the feature extraction unit.

According to an embodiment of the invention, wherein the ultrasound detection unit further comprises a band-pass filter which allows the sound data in the ultrasound band to pass and a comparator which compares the sound pressure level of the ultrasound passed the band-pass filter with a reference value and awakens the feature extraction unit when the sound pressure level of the ultrasound passed the band-pass filter is greater than the reference value.

According to an embodiment of the invention, the device may also include an arc fault feature database, which stores the plurality of reference vectors which had been extracted from actual arc fault acoustic signals. The feature comparison unit may determine to generate an arc alarm signal if the distance between the feature vector and one of the plurality of reference vectors is less than a pre-determined threshold. The arc fault feature database may also include a plurality of reference vectors which had been extracted from all kinds of interference signals. The feature comparison unit may calculate a distance between the feature vector and each of the plurality of reference vectors from actual arc fault acoustic signals, calculate a distance between the feature vector and each of the plurality of reference vectors from interference signals, and determine to generate an arc alarm signal if the minimum distance between the feature vector and the plurality of reference vectors from actual arc fault acoustic signals is less than the minimum distance between the feature vector and the plurality of reference vectors from interference signals. Therefore, the device can reduce false operations and improve the reliability of the arc fault detection.

According to an embodiment of the invention, the sound sensor is a MEMS microphone, which may reduce costs compared with the optic-fiber microphone that is too expensive to be widely used into market.

According to an embodiment of the invention, the MEMS microphones are arranged as a microphone array. The use of the microphone array can restrain the environment noise, echo and reverberation in the power device such as switchgear. The feature extraction unit, the feature comparison unit and the acoustic detection unit can be integrated within a DSP chip or FPGA chip. The MEMS microphone may be connected to the DSP or FPGA chip via synchronous serial digital port (SPORT). Also, the device may send the alarm signal by field bus such as CAN (Controller Area Network) bus interface to an electrical trip unit (ETU) such as the main circuit breaker or the master trip relay.

The approach is illustrated by way of example and not by way of limitation in the figures of the accompanying drawings in which like references indicate similar elements. It should be noted that references to "an" or "one" or "some" embodiment(s) in this disclosure are not necessarily to the same embodiment, and such references mean at least one.

FIG. 1 illustrates a flow diagram of an embodiment of a method 100 for arc fault detection according to one embodiment of the invention. In brief overview, the method 100 includes obtaining sound data from a power device (step 102), extracting from the sound data, a feature vector characterising the frequency domain sub-band energy distribution of the sound data (step 104), comparing the feature vector with a plurality of reference vectors based on actual arc fault acoustic signals and determining to generate an arc alarm signal or not based on the comparison (step 106).

Figure 2:
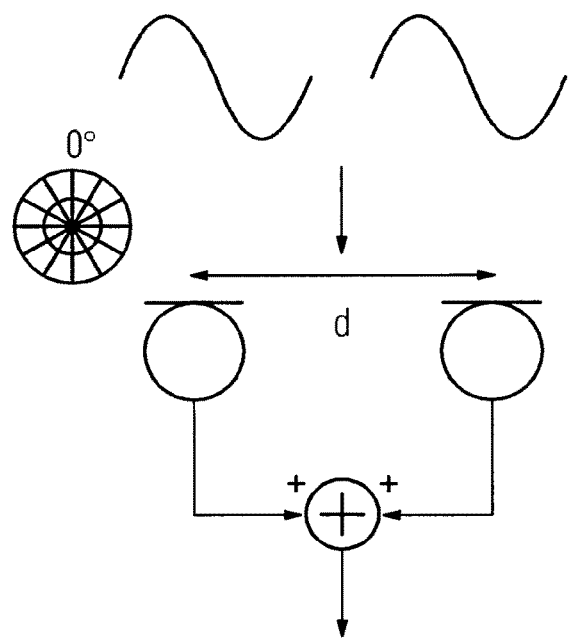
FIG. 2 illustrates a 2-microphone broadside array according to embodiments of the invention.

Further referring to FIG. 1, and in more detail, in one embodiment the sound data is obtained by one or more sound sensors arranged near the power device. MEMS microphones are used as sound sensors to sample acoustic signals continuously from the power device at step 102. The MEMS microphone may pick up sound data and output digital sound signals. In another embodiment, the MEMS microphones are arranged as a microphone array, such as a broadside array, end-fire array, etc. FIG. 2 illustrates a 2-microphone broadside array according to one embodiment of the invention. The sound signals obtained synchronously by the two microphones in the array are summed together, which can attenuate sound coming from the side of the array. In order to restrain the environment noise, echo and reverberation in the power device such as the switchgear, in one embodiment the signal from each microphone in the array may be amplified and filtered to remove noise, and then the signals from the microphone array may be preprocessed using beam forming techniques to promote SNR (Signal Noise Ratio). Such a digital MEMS microphone costs less than the optic-fiber microphone that is too expensive to be widely used into market. In another embodiment, the sound sensor may be an optic-fiber microphone, but the sound data obtained by the optic-fiber microphone needs to be converted to digital sound signals by an analog-to-digital conversion.

Figure 3:
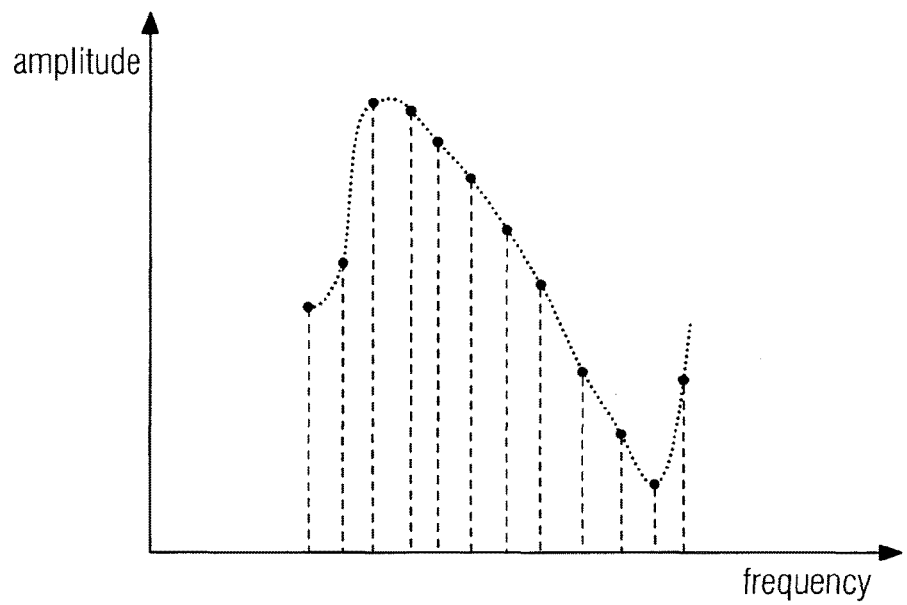
FIG. 3 illustrates a schematic diagram of features of the frequency domain sub-band energy distribution of sound data according to embodiments of the invention.

At step 104, the sound signals are processed in the frequency domain by means of the fast Fourier transform (FFT) method. A feature vector is extracted from the sound data based on the frequency domain sub-band energy distribution of the sound data. FIG. 3 illustrates a schematic diagram of features of the frequency domain sub-band energy distribution of the sound data according to embodiments of the invention. As shown in FIG. 3, the power spectrum of the sampled sound data is calculated based on FFT, and the frequency band between 0 Hz and Fs/4 (where, Fs is sampling rate) is divided to n intervals with equal length, and thus the power spectrum is also divided into n intervals. For each interval, the frequency sub-band energy value is calculated based on FFT and then is normalized. The n normalized values form an n-dimensional feature vector which can characterise the frequency domain sub-band energy distribution of the sound data, where n may be an integer between 10 and 32. Or, n may be determined according to the sampling rate.

In another embodiment, the method may include identifying from the sound data, an unusual sound, where the difference between the noise floor of the unusual sound and the noise floor of previous sound is larger than a preset value. And then the method may extract the feature vector in response to the identification of the unusual sound. So, the feature extraction may be performed only when an unusual sound occurs, which further increases the efficiency of the detection. In one example, in order to effectively identify the unusual sound from the background noise, the first 8 frame sample points (for example, 1 frame is 128 sample points at a given sample rate 48 kSPS) are used to calculate a noise floor, which is compared with the next every frame. If the average energy value of sample points of the next frame is twice larger than the noise floor, the frame is identified as an unusual sound, and in response to the identification, the feature extraction starts. The noise floor will be updated every 8 frame sample points to adapt different environment noise.

In yet another embodiment, the method includes obtaining sound data with one or more sensors capable of obtaining sound data in dual sound bands which are the audible sound band and the ultrasound band. The frequencies of the arc sounds normally range from the audible band up to the ultrasonic band, which are wider than those of the external background noise. Thus, it is reliable to identify arc sounds by detecting the dual sound band, compared to the way of detecting one single sound band which is either the audible sound band or the ultrasound band.

A high sampling rate and digital signal processing performance would be needed if the ultrasounds were used for the arc sound feature identification. Thus, in this embodiment the ultrasound signal is used for the unusual sound activity detection, and the audible-sound signal is used for the arc sound feature identification. Specifically speaking, only when the ultrasound signal is detected or found active, is the audible sound sampling awakened.

An ultra-sound microphone can be used for the special sound activity detection. The sound signal obtained by the ultra-sound microphone is filtered to allow only the sound data in the ultra-sound band to pass. Then the sound pressure level (SPL) of the passed sound data in the ultrasound band is calculated and compared with a pre-set reference value. If the sound pressure level (SPL) is greater than the pre-set reference value, then an interrupt signal is sent to start the sampling of the audible-sound signal for extracting reference vectors as described above. The pre-set reference value can be selected based on the frequencies of the ultrasound band in actual arc sounds or in the manner of experimental calibration. At step 106, the feature vector is compared with a plurality of reference vectors based on actual arc fault acoustic signals to determine whether an arc alarm signal should be generated or not. In one embodiment, the reference vectors have been extracted from various actual arc fault acoustic signals, and may be stored in an arc fault feature database. These vectors were extracted from actual arc fault acoustic signals in the same way as described at step 104. If the distance between the feature vector and one of the reference vectors is less than a pre-determined threshold, an alarm signal is generated to indicate an arc fault will occur. A lot of method may be used to calculate the distance between two vectors, such as the Euclidean distance, etc.

In another embodiment, the arc fault feature database may also include a plurality of reference vectors which had been extracted from all kinds of interference signals. The method may calculate a distance between the feature vector and each of the plurality of reference vectors from actual arc fault acoustic signals, calculate a distance between the feature vector and each of the plurality of reference vectors from interference signals, and determine to generate an arc alarm signal if the minimum distance between the feature vector and the plurality of reference vectors from actual arc fault acoustic signals is less than the minimum distance between the feature vector and the plurality of reference vectors from interference signals. Thus, the method can reduce false operations and improve the reliability of the arc fault detection.

From the above, it can be seen that the method can provide the forecast and early warning of arc faults before arc flash faults occur, and may improve the stability and reliability of the arc fault detection compared with other detection methods that compare the sound pressure level (SPL) or the energy of certain sub-bands of the arc sound signal with a preset value. The method can also be programmed into hardware such as Digital Signal Processor (DSP) or Field Programmable Gata Array (FPGA) chips. The MEMS microphone may be connected to or integrated with the DSP or FPGA chip via synchronous serial digital port (SPORT).

Figure 4:
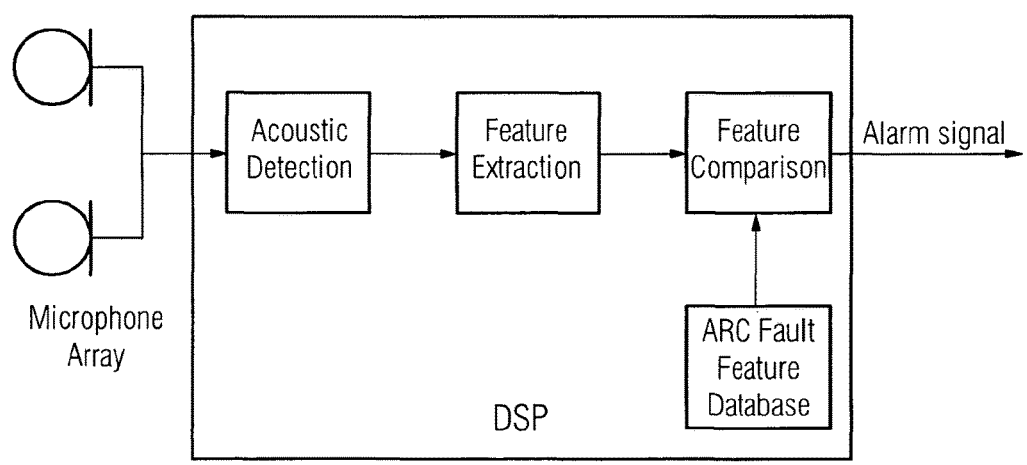
FIG. 4 illustrates a block diagram of an example device for arc fault detection according to embodiments of the invention.

Referring now to FIG. 4, a block diagram of an example device for arc fault detection according to one embodiment of the invention is depicted. In brief overview, the device comprises one or more sound sensors, a feature extraction unit and a feature comparison unit. The MEMS microphones are used as sound sensors and arranged as a microphone array. The microphone array is placed near a power device, for example, inside the switchgear, and obtains sound data from the switchgear. The feature extraction unit extracts from the sound data, a feature vector characterising the frequency domain sub-band energy distribution of the sound data as described above. The feature comparison unit compares the feature vector with a plurality of reference vectors which had been extracted from actual arc fault acoustic signals in an arc fault feature database, and determines to generate an arc alarm signal or not based on the comparison.

In one embodiment, the device may further comprise an acoustic detection unit for identifying from the sound data, an unusual sound as described above. The feature extraction unit may extract the feature vector in response to the identification of the unusual sound, which further increases the efficiency of the detection.

In one embodiment, the arc fault feature database may also include a plurality of reference vectors which had been extracted from all kinds of interference signals. The feature comparison unit may calculate a distance between the feature vector and each of the plurality of reference vectors from actual arc fault acoustic signals, calculate a distance between the feature vector and each of the plurality of reference vectors from interference signals, and determine to generate an arc alarm signal if the minimum distance between the feature vector and the plurality of reference vectors from actual arc fault acoustic signals is less than the minimum distance between the feature vector and the plurality of reference vectors from interference signals. So, the device can reduce false operations and improve the reliability of the arc fault detection.

As shown in FIG. 4, the feature extraction unit, the feature comparison unit and the acoustic detection unit can be integrated or implemented within a DSP chip. The MEMS microphone may be connected to the DSP chip via synchronous serial digital port (SPORT). Also, the device may send the alarm signal by CAN (Controller Area Network) bus interface to an electrical trip unit such as the main circuit breaker or the master trip relay. The device is a stand-alone device and does not need any physical connection with the primary power system in the switchgear.

Figure 5:
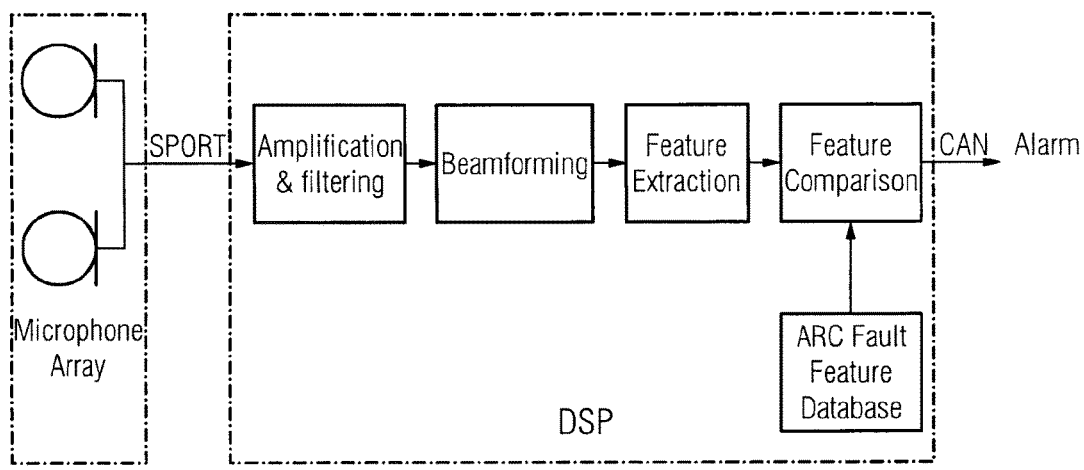
FIG. 5 illustrates a block diagram of another example device with a 2-microphone array according to embodiments of the invention.

Referring now to FIG. 5, illustrated is a block diagram of another example device with a 2-microphone array according to embodiments of the invention. As shown in FIG. 5, besides the microphone array, the feature extraction unit and a feature comparison unit, the device comprises an amplification and filtering unit, which can amplify and filter the signal from each microphone in the array to remove noise. The device may also include a beam forming unit such as a broadside array beam former for promoting SNR (Signal Noise Ratio) of the sound signals obtained by the microphone array.

Figure 6:
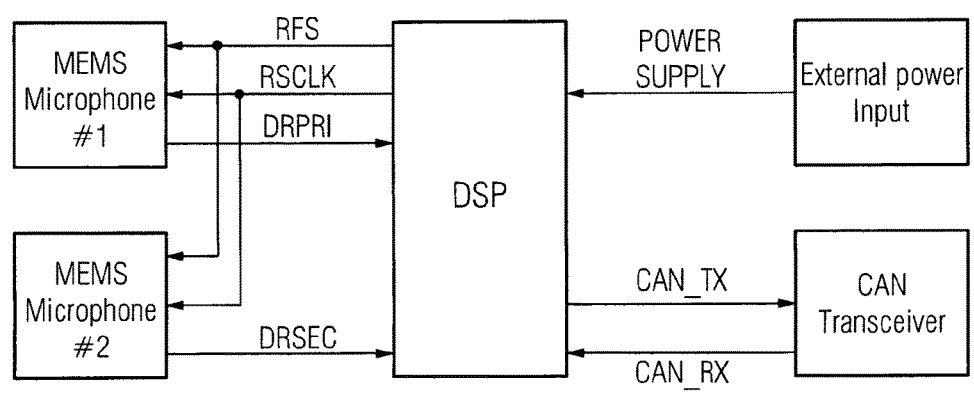
FIG. 6 illustrates a block diagram of another example device with a 2-microphone array according to embodiments of the invention.

Referring now to FIG. 6, a block diagram of another example device with a 2-microphone array is depicted according to one embodiment of the invention. The device comprises two microphones and a DSP chip. The two-microphones pick up sound data and send to the DSP chip via a digital port. After the data being processed in the DSP chip, the result can be sent out, for example, to ETU via CAN bus by CAN transceiver. The two microphones are connected with the DSP chip via the SPORT port controlled by a direct memory access (DMA) controller in the DSP chip. There are two data input channels corresponding to the two microphones as shown in FIG. 6. The two microphones can be strictly synchronized with the SPORT port primary channel and secondary channel. The two microphones share the same receiving frame sync signal (RFS) and the same receive clock signal (RSCLK) from the DSP chip, while the DSP chip can receive data from the first microphone through the primary channel (DRPRI) and data from the second microphone through the secondary channel (DRSEC). In one embodiment, the sound data obtained synchronously by the two microphones in the array may be summed together to attenuate sound coming from the side of the array. In other embodiments, the signal from each microphone in the array is amplified by an amplifier and filtered by a filter to remove noise, and then the signals from the microphone array are preprocessed using beam forming techniques to promote SNR, which can restrain the environment noise, echo and reverberation in the switchgear. The device may be externally powered, for example, the power supply of the device is from external 24 Vdc input. Or, the device may have an internal power supply.

Figure 7:
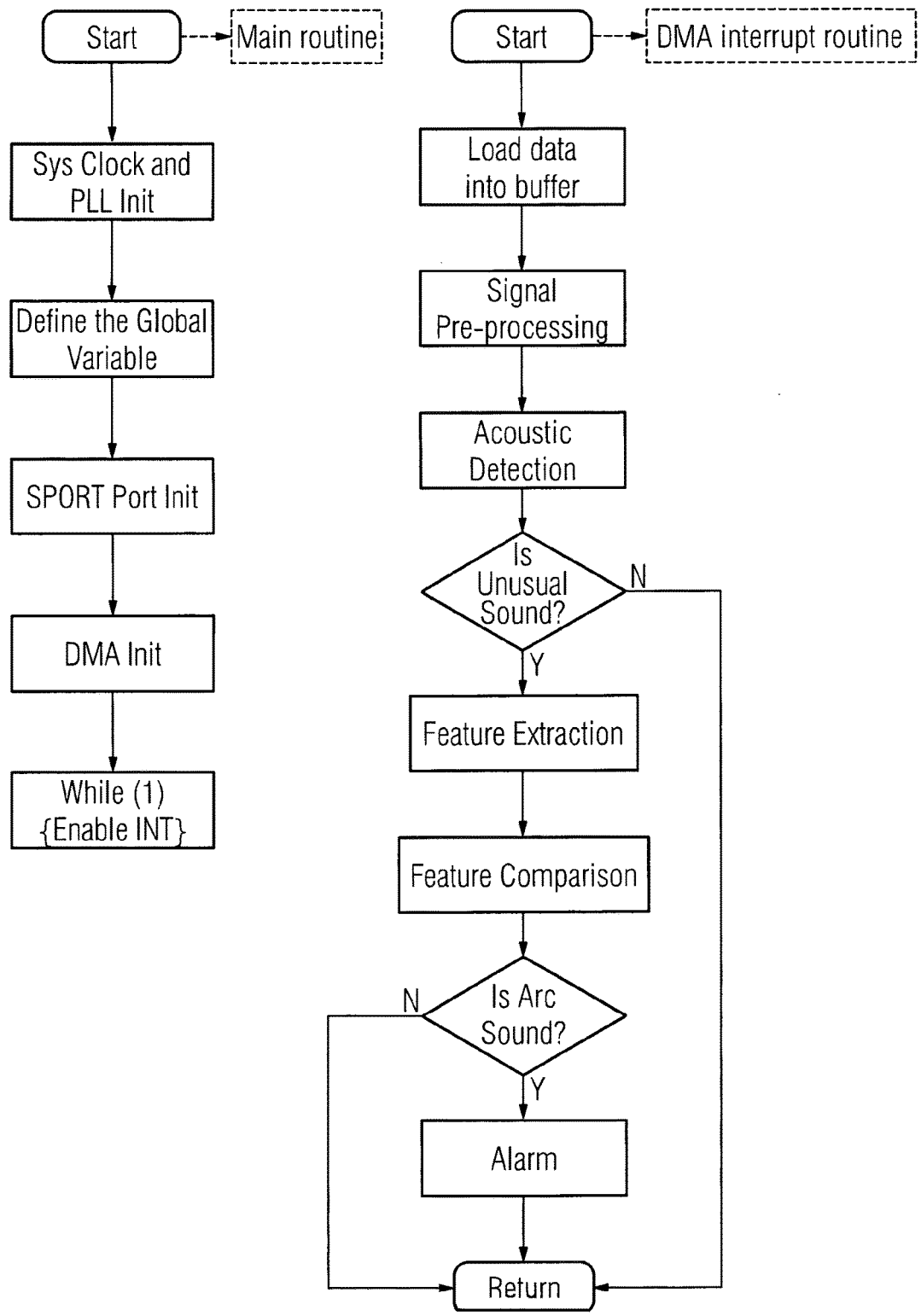
FIG. 7 illustrates the working principle of an example device for arc fault detection according to embodiments of the invention.

Referring now to FIG. 7, illustrated is the working principle of the example device as shown in FIG. 6. When the device powers up, the device first does some initialization work, such as the definition of global variable and the initialization of system clock, Phase Locked Loop, SPORT port, DMA controller, etc. The DMA controller is configured into Auto-Flow mode that can get data from SPORT port continuously without the intervention of the processor core in the DSP chip. There are two data buffers in the internal memory of the DSP chip, and the DMA controller may load data in real time into one buffer via the SPORT port. When the buffer is full, the DMA controller sends out the interrupt flag (INT) to the processor core in the DSP chip and begins to load data in real time into the other buffer. In the meantime, the core begins to process the sound data from the microphone as is mentioned above in the DMA interrupt routine. As shown in FIG. 7, the pre-processing of the sound signal is performed, such as amplification, filtering and beam forming. Then the unusual sound data frame is recognized by comparing the average energy of the frame with the noise floor, which is calculated and updated periodically. Upon the unusual sound is identified, the core starts to extract the feature vector from the sound data and compare it with the arc fault feature database. If the minimum distance between the feature vector and vectors from actual arc fault acoustic signals is less than the minimum distance between the feature vector and vectors from interference signals, an alarm signal is generated to indicate that the arc faults will possibly happen. The device not only can avoid most of the arc faults, but also can improve the stability of the arc fault detection. In another embodiment, the microphones, DSP chip, CAN transceiver, the arc fault feature database, and/or power unit can be intergrated in a circuit board. The device of the present invention is a stand-alone device, which can be placed where arc faults might occur in the power equipment, for example, inside a switchgear.

Figure 8:
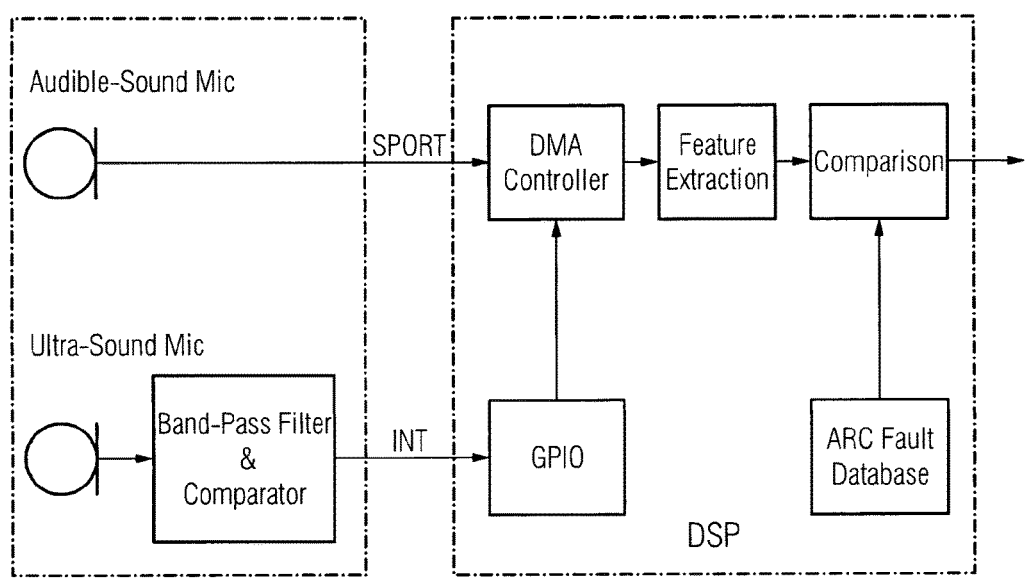
FIG. 8 illustrates a block diagram of another example device with a 2-microphone array capable of obtaining sound data in the ultrasound band and in the audible sound band according to embodiments of the invention.

FIG. 8 illustrates a block diagram of another example device with a 2-microphone array capable of obtaining sound data in the ultrasound band and audible sound band according to embodiments of the invention. The device comprises an audible-sound microphone, an ultrasound microphone, an ultrasound detection unit and a DSP chip. The microphones are preferably MEMS-based microphones which are much cheaper than optic-fiber microphones. As shown in FIG. 8, the DSP chip is connected with the audible-sound microphone via such digital ports as SPORT. The ultrasound detection unit is connected with the ultra-sound microphone, as shown in FIG. 8. The ultrasound detection unit includes a band-pass filter and a comparator. The band-pass filter allows the sound data in the ultrasound band to pass, and the comparator compares the sound pressure level (SPL) of the ultrasound passed the band-pass filter with a pre-set reference value. The ultrasound detection unit is connected with the DSP chip via GPIO (General Purpose Input Output) with the I/O interrupt function.

When the ultra-sound detection unit finds that the sound pressure level (SPL) of the sound data in the ultrasound band which passes the filter is greater than the reference value, then an interrupt signal (INT) such as an I/O interrupt is sent to the DSP chip. After the DSP receives the interrupt signal (INT) via the GPIO shown in FIG. 8, the DSP initializes and starts to receive audible sound data from the audible-sound Microphone via SPORT. The DSP extracts the feature vector from the sound data in the audible-sound band and compares it with the actual arc fault vectors stored in the database. If the minimum distance between the feature vector and vectors from actual arc fault acoustic signals is less than the minimum distance between the feature vector and vectors from interference signals, an alarm signal is generated to indicate that the arc faults will possibly happen.

Alternatively, the two microphones illustrated in FIG. 8 can be replaced by one. One microphone capable of picking up sound data both in the audible band and in the ultra-sound band can be used in this invention. In this case, two band-pass filters are needed to connect with the microphone to pass sound data in the audible-sound band and those in the ultra-sound band separately.

While certain embodiments of methods and devices for arc fault detection have been described, these embodiments are example and in no way limit the scope of the described methods or systems. Those having skill in the relevant art can effect changes to form and details of the described methods and devices without departing from the broadest scope of the invention. Thus, the scope of the present disclosure described herein should not be limited by any of the example embodiments and should be defined in accordance with the accompanying claims and their equivalents.

What is claimed is:

1. A method for arc fault detection, the method comprising:
   obtaining sound data from a power device;
   extracting, from the sound data, a feature vector characterising a frequency domain sub-band energy distribution of the sound data; and
   comparing the feature vector with a plurality of reference vectors based on actual arc fault acoustic signals, and determining whether or not to generate an arc alarm signal indicative of arc fault detection, wherein said obtaining comprises:
   obtaining the sound data with one or more sensors capable of obtaining sound data in dual sound bands, the dual sound bands being an audible sound band and an ultrasound band, and
   wherein said extracting comprises:
   monitoring sound data in the ultrasound band, and
   starting to extract the feature vector from the sound data in the audible band, when the sound data in the ultrasound band are detected.

2. The method of claim 1, wherein said extracting comprises:
   identifying from the sound data, an unusual sound wherein a difference between a noise floor of the unusual sound and a noise floor of a previous sound is relatively larger than a preset value; and extracting the feature vector in response to the identification of the unusual sound.

3. The method of claim 1, wherein said comparing comprises:
passing sound data in the ultrasound band,
comparing a sound pressure level of the passed sound data in the ultrasound band with a reference value, and wherein the extracting includes starting to extract the feature vector from the sound data in the audible band when the sound pressure level of the passed sound data in the ultrasound band is relatively greater than the reference value.

4. The method of claim 1, wherein said extracting comprises:
calculating a distance between the feature vector and each of the plurality of reference vectors; and
determining to generate an arc alarm signal upon a distance between the feature vector and one of the plurality of reference vectors being less than a threshold.

5. The method of claim 1, wherein the plurality of reference vectors are vectors previously extracted from various actual arc fault acoustic signals in a same way as the feature vector, wherein the plurality of reference vectors being stored in an arc fault feature database.

6. The method of claim 5, wherein the arc fault feature database also includes a plurality of reference vectors, previously extracted from all kinds of interference signals.

7. The method of claim 6, wherein said extracting comprises:
calculating a distance between the feature vector and each of the plurality of reference vectors from actual arc fault acoustic signals;
calculating a distance between the feature vector and each of the plurality of reference vectors from interference signals; and
determining to generate an arc alarm signal if a minimum distance between the feature vector and the plurality of reference vectors from actual arc fault acoustic signals is relatively less than a minimum distance between the feature vector and the plurality of reference vectors from interference signals.

8. The method of claim 1, wherein the sound data is obtained with a MEMS microphone.

9. The method of claim 8, wherein the sound data is obtained with a microphone array.

10. A device for arc fault detection, the device comprising:
one or more sound sensors arranged near a power device, to obtain sound data from the power device;
a feature extraction unit, to extract from the sound data, a feature vector characterising a frequency domain sub-band energy distribution of the sound data; and
a feature comparison unit, to compare the feature vector with a plurality of reference vectors based on actual arc fault acoustic signals, to determine whether or not to generate an arc alarm signal indicative of arc fault detection, wherein
the one or more sound sensors are configured to obtaining the sound data in dual sound bands, the dual sound bands being an audible sound band and an ultrasound band,
the feature extraction unit is configured to monitoring sound data in the ultrasound band, and
extract the feature vector from the sound data in the audible band when the sound data in the ultrasound band are detected.

11. The device of claim 10, further comprising:
an acoustic detection unit to identify, from the sound data, an unusual sound, wherein a difference between a noise floor of the unusual sound and a noise floor of a previous sound is relatively larger than a preset value, wherein the feature extraction unit is configured to extract the feature vector in response to the identification of the unusual sound.

12. The device of claim 10, further comprising:
an ultrasound detection unit to monitor the sound data in the ultrasound band obtained by the one or more sound sensors.

13. The device of claim 12, wherein the sound sensors include one audible sound sensor and one ultrasound sensor, the ultrasound sensor is connected with the ultrasound detection unit, and the audible sound sensor is connected with the feature extraction unit.

14. The device of claim 13, further comprising:
a band-pass filter to allow the sound data in the ultrasound band to pass; and
a comparator to compare a sound pressure level of the ultrasound passed the band-pass filter with a reference value and to awaken the feature extraction unit when the sound pressure level of the ultrasound passed the band-pass filter is relatively greater than the reference value.

15. The device of claim 10, wherein the feature comparison unit comprises:
means for calculating a distance between the feature vector and each of the plurality of reference vectors; and
means for determining to generate an arc alarm signal upon the distance between the feature vector and one of the plurality of reference vectors is less than a threshold.

16. The device of claim 10, wherein the plurality of reference vectors were previously extracted from various actual arc fault acoustic signals in a same way as the feature vector, and wherein the plurality of reference vectors are stored in an arc fault feature database.

17. The device of claim 16, wherein the arc fault feature database includes a plurality of reference vectors, extracted from all kinds of interference signals.

18. The device of claim 17, wherein the feature comparison unit comprises:
means for calculating a distance between the feature vector and each of the plurality of reference vectors from actual arc fault acoustic signals;
means for calculating a distance between the feature vector and each of the plurality of reference vectors from interference signals; and
means for determining to generate an arc alarm signal upon a minimum distance between the feature vector and the plurality of reference vectors from actual arc fault acoustic signals being less than a minimum distance between the feature vector and the plurality of reference vectors from interference signals.

19. The device of claim 10, wherein the sound sensor is a MEMS microphone.

20. The device of claim 19, wherein the sound sensors are arranged as a microphone array.

21. An arc fault protection system, comprising:
one or more sound sensors arranged near a power device, for obtaining sound data from the power device; and
a processor and a memory, the memory containing instructions that, when executed by the processor, configures the processor to:

extract from the sound data, a feature vector characterising a frequency domain sub-band energy distribution of the sound data;
compare the feature vector with a plurality of reference vectors based on actual arc fault acoustic signals, to determine whether or not to generate an arc alarm signal,
obtain the sound data via the one or more sensors in dual sound bands, the dual sound bands being an audible sound band and an ultrasound band,
monitor sound data in the ultrasound band, and
start to extract the feature vector from the sound data in the audible band, when the sound data in the ultrasound band are detected.

22. The arc fault protection system of claim 21, wherein the arc alarm signal is indicative of arc fault detection.

* * * * *